United States Patent
Jeon et al.

(10) Patent No.: US 8,586,427 B2
(45) Date of Patent: *Nov. 19, 2013

(54) THIN FILM TRANSISTORS AND METHODS OF MANUFACTURING THIN FILM TRANSISTORS

(75) Inventors: Sang-Hun Jeon, Gyeonggi-do (KR); Moon-Sook Lee, Seoul (KR); Byeong-Ok Cho, Seoul (KR)

(73) Assignee: Samsung Electronics Co., Ltd. (KR)

(*) Notice: Subject to any disclaimer, the term of this patent is extended or adjusted under 35 U.S.C. 154(b) by 172 days.

This patent is subject to a terminal disclaimer.

(21) Appl. No.: 13/204,785

(22) Filed: Aug. 8, 2011

(65) Prior Publication Data

US 2011/0294268 A1     Dec. 1, 2011

Related U.S. Application Data

(63) Continuation of application No. 12/497,852, filed on Jul. 6, 2009, now Pat. No. 8,022,410.

(30) Foreign Application Priority Data

Jul. 8, 2008   (KR) .................. 10-2008-0066255

(51) Int. Cl.
   *H01L 21/8234*   (2006.01)
   *H01L 29/786*   (2006.01)
(52) U.S. Cl.
   USPC ............ 438/151; 438/159; 257/72; 257/401; 257/E29.242; 257/E29.273; 257/E29.285; 257/E29.299

(58) Field of Classification Search
   USPC ............ 438/151, 159; 257/72, 401, E29.242, 257/E29.273, E29.285, E29.299
   See application file for complete search history.

(56) References Cited

U.S. PATENT DOCUMENTS

| | | | |
|---|---|---|---|
| 5,097,297 A | 3/1992 | Nakazawa | |
| 5,177,577 A | 1/1993 | Taniguchi et al. | |
| 6,828,582 B1 | 12/2004 | Ando et al. | |
| 7,198,977 B2 | 4/2007 | Shukla et al. | |
| 7,550,767 B2 | 6/2009 | Yang et al. | |
| 8,022,410 B2* | 9/2011 | Jeon et al. ............ | 257/72 |
| 2007/0012950 A1 | 1/2007 | Cain et al. | |
| 2007/0018151 A1 | 1/2007 | Sirringhaus et al. | |

FOREIGN PATENT DOCUMENTS

JP       2006-190922      7/2006
KR     1020060011165 A    2/2006

* cited by examiner

*Primary Examiner* — Evan Pert
(74) *Attorney, Agent, or Firm* — Myers Bigel Sibley & Sajovec

(57) ABSTRACT

A thin film transistor includes a layer structure having a gate electrode, a gate insulation layer and a channel layer. A source line may contact the channel layer, and may extend along a direction crossing over the gate electrode. The source line may partially overlap the gate electrode so that both sides of the source line overlapping the gate electrode may be entirely positioned between both sides of the gate electrode. A drain line may make contact with the channel layer and may be spaced apart from the source line by a channel length. The drain line may have a structure symmetrical to that of the source line. Overlap areas among the gate electrode, the source line and the drain line may be reduced, so that the thin film transistor may ensure a high cut-off frequency.

11 Claims, 8 Drawing Sheets

THIN FILM TRANSISTORS AND METHODS OF MANUFACTURING THIN FILM TRANSISTORS

RELATED APPLICATIONS

This application claims priority under 35 USC §120 as a continuation application of U.S. patent application Ser. No. 12/497,852, filed Jul. 6, 2009 now U.S. Pat. No. 8,022,410 which in turn claims priority under 35 USC §119 to Korean Patent Application No. 2008-66255, filed on Jul. 8, 2008 in the Korean Intellectual Property Office (KIPO), the disclosures of which are herein incorporated by reference in their entirety as if set forth fully herein.

BACKGROUND

The present invention relates to semiconductors, and more particularly, to transistors and methods of manufacturing the same.

Semiconductor chips are widely employed in various applications such as radio frequency identification (RFID) apparatuses, RFID tags, electronic article surveillance (EAS) tags, sensing devices, etc. These semiconductor chips may be manufactured with a low cost to reduce prices of products that rely thereon.

Further, the semiconductor chip may include thin film transistors having a high cut-off frequency for a proper operation of the semiconductor chip. For example, the semiconductor chip may make contact with a reader to read various information stored in the semiconductor chip. However, a current semiconductor chips may not include thin film transistors having a desired high cut-off frequency with a low manufacturing cost.

SUMMARY

Some embodiments of the present invention provide a thin film transistor having a high cut-off frequency for various electronic applications such as RFID apparatuses, RFID goods, EAS tags, sensing devices, etc.

Some embodiments of the present invention provide a method of manufacturing a thin film transistor having a high cut-off frequency with a low cost.

According to some embodiments, a thin film transistor includes a layer structure, a source line and a drain line. The layer structure may include a gate electrode, a gate insulation layer and a channel layer. The source line may make contact with the channel layer and extends along a direction crossing over the gate electrode. Some embodiments provide that the source line partially overlaps the gate electrode, so that both sides of the source line overlapping the gate electrode are entirely positioned between both sides of the gate electrode. The drain line may make contact with the channel layer and be spaced apart from the source line by a channel length. Some embodiments provide that the drain line has a structure symmetrical to that of the source line.

In some embodiments, the drain line may partially overlap the gate electrode, so that both sides of the drain line overlapping the gate electrode may be entirely positioned between the both sides of the gate electrode.

In some embodiments, each of the source and the drain lines may have a line width substantially the same as the channel length. Some embodiments provide that each of the source and the drain lines may have a line width substantially the same as a minimum line width of a process for forming the source and the drain lines.

In some embodiments, the source line may be partially spaced apart from a side of the gate electrode, so that the source line may partially surround the side of the gate electrode. Some embodiments provide that the drain line may be partially spaced apart from the side of the gate electrode to symmetrically extend with the source line.

In some embodiments, the source line may include a first portion, a second portion and a third portion. The first portion may cross over the gate electrode. The second portion may be connected with a first end of the first portion, and may be spaced apart from a first side of the gate electrode. The third portion may be connected with a first end of the second portion, and may be spaced apart from a second side of the gate electrode connected with the first side.

In some embodiments, the source line may include a first portion, a second portion, a third portion and a fourth portion. Some embodiments provide that the first portion may cross over the gate electrode. The second portion may be connected with a first end of the first portion, and may be spaced apart from a first side of the gate electrode. The third portion may be connected with a second end of the first portion, and may be spaced apart from a third side of the gate electrode opposed to the first side of the gate electrode. The fourth portion may be connected with ends of the second and third portions, and may be spaced apart from a second side of the gate electrode connected with the first and third side of the gate electrode.

In some embodiments, the source line may include a first portion, a second portion and a third portion. The first portion may cross over the gate electrode. The second portion may face with the first portion, and may be spaced apart from a second side of the gate electrode. The third portion may connect a center of the first portion to a center of the second portion, and may be positioned on the gate electrode.

In some embodiments, contacts may be respectively formed on extended portions of the source and the drain lines extending from portions of the source and the drain lines overlapped with the gate electrode.

In some embodiments, a sum of a distance between the extended portion of the source line on which the contact is formed and the side of the gate electrode, and a distance between the extended portion of the drain line on which the contact is formed and the side of the gate electrode may be substantially two times larger than the channel length.

In some embodiments, a sum of a distance between the source line not overlapping the gate electrode and the side of the gate electrode along an X-axis, and a distance between the drain line not overlapping the gate electrode and the side of the gate electrode along the X-axis may be substantially two times larger than the maximum align margin along the X-axis in a process for forming the source and the drain lines.

In some embodiments, a sum of a distance between a first end of the source line crossing over the gate electrode and the side of the gate electrode along a Y-axis, and a distance between a second end of the source line crossing over the gate electrode and the side of the gate electrode along the Y-axis may be substantially two times larger than a maximum alignment margin along the Y-axis in a process for forming the source and the drain lines.

In some embodiments, ends of the first portion of the source line crossing over the gate electrode may be formed to be spaced apart from adjacent patterns.

In some embodiments, the channel layer may include a nano wire, nano particles, an organic material, a hybrid material, etc. These may be used alone or in a combination thereof.

In some embodiments, the layer structure may be positioned on an insulation region of a substrate, and the gate electrode may make contact with an upper surface of the substrate.

In some embodiments, the source and the drain lines may make contact with a surface of an insulation region of a substrate, and the channel layer of the layer structure may make contact with the source line, the drain line and the substrate.

According to some embodiments, there are provided methods of manufacturing a thin film transistor. Such methods may provide that a layer structure is formed by stacking a gate electrode, a gate insulation layer and a channel layer. In some embodiments, a source line and a drain line are formed to make contact with the channel layer. Some embodiments provide that the source line extends along a direction crossing over the gate electrode, and partially overlaps the gate electrode, so that both sides of the source line overlapping the gate electrode are entirely positioned between both sides of the gate electrode. In some embodiments, the drain line is spaced apart from the source line by a channel length, and has a structure symmetrical to that of the source line.

In some embodiments, the source and the drain lines may be formed through a printing process.

According to some embodiments, there are provided further methods of manufacturing a thin film transistor. According to such methods, a gate electrode is formed on a substrate. Some embodiments provide that a gate insulation layer is formed to cover the gate electrode and a channel layer is formed to cover the gate insulation layer. In some embodiments, a source line and a drain line are formed on the channel layer. Some embodiments provide that the source line extends along a direction crossing over the gate electrode, and partially overlaps the gate electrode, so that both sides of the source line overlapping the gate electrode are entirely positioned between both sides of the gate electrode. Some embodiments provide that the drain line is spaced apart from the source line by a channel length, and has a structure symmetrical with that of the source line.

In some embodiments, a printing process for forming the source and the drain lines may provide a minimum line width substantially smaller than a maximum misalignment width.

According some embodiments, there are provided yet further methods of manufacturing a thin film transistor. In some embodiments, a source line and a drain line are formed on a substrate to be spaced apart from each other by a channel length. Some embodiments provide that a channel layer is formed to cover the substrate, the source line and the drain line. In some embodiments, a gate insulation layer is formed to cover the channel layer. Some embodiments provide that a gate electrode is formed on the gate insulation layer to cover the source and the drain lines.

In some embodiments, both sides of the gate electrode may be positioned between sides of the source and the drain lines.

In some embodiments, the source line may be partially spaced apart from a side of the gate electrode, so that the source line partially may surround the side of the gate electrode. Further, the drain line may be partially spaced apart from the side of the gate electrode to symmetrically extend with the source line.

According to some embodiments, overlap areas among the gate electrode, the source line and the drain line are decreased, so that parasitic capacitances among the gate electrode, the source line and the drain line may be reduced. Thus, the thin film transistor may ensure a desired high cut-off frequency. Further, the thin film transistor may be manufactured with a low cost price because the source and the drain lines in the thin film transistor may be formed by a printing process.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DESCRIPTION OF EMBODIMENTS

Figure 1:
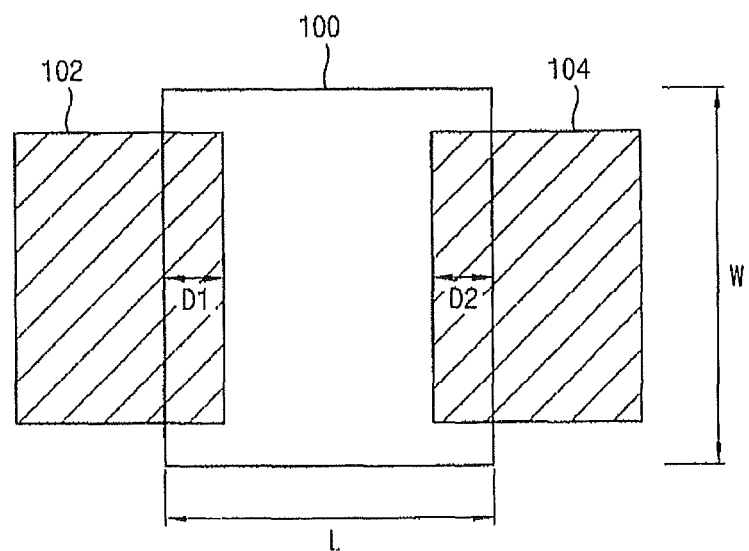
FIG. 1 is a schematic plan view illustrating a thin film transistor having relatively small overlap lengths.

Various example embodiments will be described more fully hereinafter with reference to the accompanying drawings, in which some example embodiments are illustrated. The invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

Reference numerals are indicated in detail in some embodiments of the present invention, and their examples are represented in reference drawings. Throughout the drawings, like reference numerals are used for referring to the same or similar elements in the description and drawings.

Cut-Off Frequency Relative to Gate Overlap Length

Considering smooth data communications between a radio frequency identification (RFID) chip and a reader, a distance between an RFID passive tag and the reader may be in a range below about 10 cm. Here, the RFID chip may have a cut-off frequency of about 13.56 MHz. Generally, a cut-off frequency in a transistor relative to a channel length may be calculated by the following equation (1):

$$f_T = \frac{\mu_n(V_{gs} - V_T)}{2\pi L^2} \qquad \text{Equation (1)}$$

When a thin film transistor has a channel including an organic material, such a thin film transistor may have a measured cut-off frequency considerably lower than a calculated cut-off frequency through the equation (1). For example, the measured cut-off frequency of the thin film transistor may be about one-eighth of the calculated cut-off frequency.

Meanwhile, a cut-off frequency in a transistor is calculated by the following equation (2):

$$w = 2\pi f, \; w_T = 2\pi f_T = \frac{g_m}{(C_{gs} + C_{gd})} \qquad \text{Equation (2)}$$

$$C_{gs} + C_{gd} \approx C_{OX} \cdot W \cdot L$$

$$g_m = \mu \cdot C_{ox}\left(\frac{W}{L}\right)(V_{gs} - V_T)$$

$$\therefore f_T = \frac{\mu_n(V_{gs} - V_T)}{2\pi L^2}$$

Considering a relation between the equation (1) and the equation (2), the cut-off frequency may be calculated by the equation (1) based on assumptions that a sum of a capacitance between a gate and a source and a capacitance between the gate and a drain is substantially the same as a multiplication of a capacitance of a gate insulation layer, a length of the gate and a width of the gate. When overlaps between the gate and the source and between the gate and the drain are considerably small, the capacitances among the gate, the source and the drain may be disregarded, so that the calculated cut-off frequency by the equation (1) may be substantially the same as the actually measured cut-off frequency of the transistor. However, the cut-off frequency calculated by the equation (1) may be inaccurate when overlaps among the gate, the source and the drain are relatively large.

Figure 2:
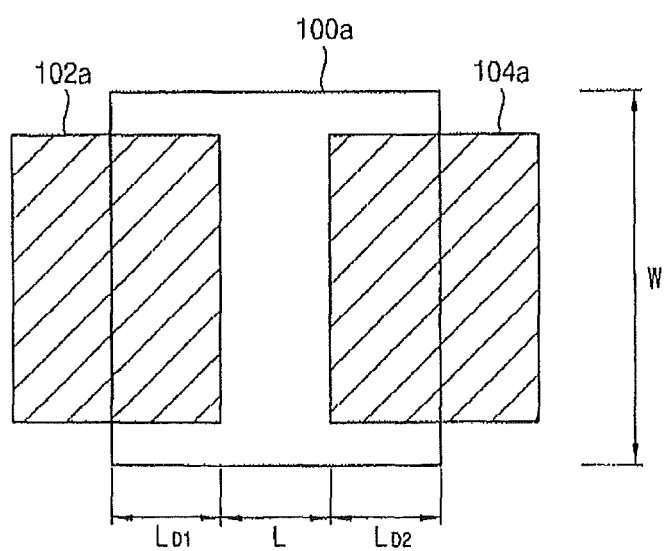
FIG. 2 is a schematic plan view illustrating a thin film transistor having overlap lengths substantially the same as a channel length.

Reference is now made to FIG. 1, which is a schematic plan view illustrating a thin film transistor having relatively small overlap lengths and FIG. 2, which is a schematic plan view illustrating a thin film transistor having overlap lengths substantially the same as a channel length. In FIGS. 1 and 2, "W" indicates a width of a gate 100 in the thin film transistor.

As illustrated in FIG. 1, when both of a first overlap length D1 between a gate 100 and a source 102 and a second overlap length D2 between the gate 100 and a drain 104 are substantially smaller than a channel length L of the transistor, a capacitance of a gate insulation layer, which may be obtained by a combination of a gate to source capacitance (Cgs), a gate to bulk capacitance (Cgb) and a gate to drain capacitance (Cgd), may have a maximum value obtained by Cox·W·L according to the equation (2). In this regard, the cut-off frequency of the transistor calculated by the equation (1) may be substantially the same as or substantially similar to an actually measured cut-off frequency of the transistor.

Referring to FIG. 2, when both of a third overlap length $L_{D1}$ between a gate 100a and a source 100b and a fourth overlap length $L_{D2}$ between the gate 100a and a drain 104a are substantially the same as a channel length L of the transistor, a capacitance of a gate insulation may become about three times larger than a capacitance of a gate insulation layer without any overlap length. Hence, a cut-off frequency of the transistor may decrease about one-third of a cut-off frequency of a transistor having no overlap length according to the equation (2).

As described above, the overlaps among the gate, the source and the drain may be reduced to improve the cut-off frequency of the thin film transistor. In other words, a thin film transistor may have a higher cut-off frequency by reducing overlaps among a gate, a source and a drain.

Figure 3:
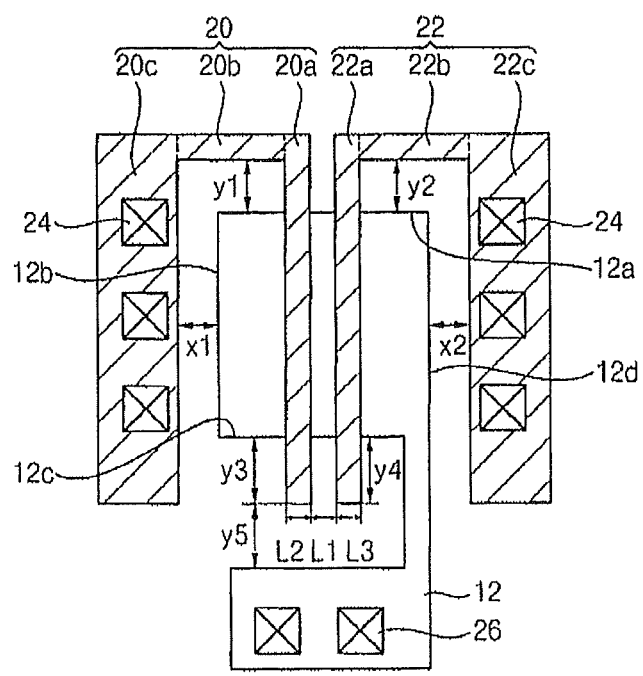
FIG. 3 is a plan view illustrating a thin film transistor according to some embodiments of the present invention.

Reference is now made to FIG. 3, which is a plan view illustrating a thin film transistor according to some embodiments of the present invention. The thin film transistor includes a gate electrode 12 positioned on a substrate (not illustrated). The substrate may include a semiconductor substrate, for example, a silicon substrate, a germanium substrate, and/or a silicon-germanium substrate, among others. In some embodiments, the substrate may include an insulation substrate such as a plastic substrate, and/or a metal oxide substrate, among others.

First contacts 26 may be provided at one portion of the gate electrode 12. Each of the first contacts 26 may include a conductive material such as polysilicon, metal and/or metal compound, among others. Some embodiments provide that these may be used alone and/or in a mixture thereof.

A gate insulation layer (not illustrated) may be disposed on the gate electrode 12. Some embodiments provide that the gate insulation layer may include an organic material, an inorganic material, and/or a hybrid material, among others.

A channel layer (not illustrated) may be positioned on the gate insulation layer. The channel layer may include a nano wire, nano particles, an organic material, and/or a hybrid material, among others. In some embodiments, the channel layer may include zinc oxide (ZnOx), gallium nitride (GaNx), silicon (Si), silicon germanium (SiGe), cadmium sulfide (CdSx), vanadium oxide (VOx,) nickel oxide (NiOx), carbon (C), gallium arsenic (GaAs), silicon carbide (SiCx), zinc sulfide (ZnSx), zinc selenium (ZnSex), zinc tellurium (ZnTex), cadmium sulfide (CdSx), cadmium selenium (CdSex), cadmium tellurium (CdTex), hydrargyrum selenium (HgSex), hydrargyrum tellurium (HgTex), copper aluminum sulfide (CuAlxSy), aluminum indium phosphide (AlInxPy), aluminum gallium arsenic (AlGaxAsy), aluminum indium arsenic (AlInxAsy), aluminum gallium selenium (AlGaxSby), aluminum indium selenium (AlInxSby), gallium indium phosphide (GaInxPy), gallium indium arsenic (GaInxAsy), gallium indium selenium (GaInxSby), gallium phosphor arsenic (GaPxAsy), gallium arsenic selenium (GaAsxSby), indium phosphor arsenic (InPxAsy), and/or indium arsenic selenium (InAsxSby), among others. Some embodiments provide that these may be used alone or in a combination thereof. In some embodiments, the channel layer may be obtained by a printing process, a spraying process and/or a plating process to reduce a manufacturing cost of the thin film transistor. In some embodiments, the channel layer may include zinc oxide obtained by the printing process.

A source line 20 and a drain line 22 are positioned on the channel layer. The source and the drain lines 20 and 22 may extend along a direction partially crossing over the gate electrode 12. The source and drain lines 20 and 22 may be spaced apart from each other by a channel length L1 at a portion of the gate electrode 12 on which the source and drain lines 20 and 22 are overlapped with the gate electrode 12.

The source line 20 may include a first portion 20a, a second portion 20b and a third portion 20c. As illustrated, the gate electrode 12 may include a first side 12a, a second side 12b, a third side 12c and a fourth side 12d. For example, the first side 12a of the gate electrode 12 may be opposed to the third side 12c of the gate electrode 12. The second side 12b may be connected with the first and the third sides 12a and 12c. The fourth side 12d may be opposed to the second side 12b, and connected with the first side 12a. Some embodiments provide that the source line 20 may cross over the first and the third sides 12a and 12c of the gate electrode 12.

The first portion 20a of the source line 20 may cross over the gate electrode 12. The second portion 20b of the source line 20 may be connected to the first portion 20a, and may be spaced apart from the first side 12a of the gate electrode 12. The third portion 20c of the source line 20 may be connected with the second portion 20b, and may be spaced apart from the second side 12b of the gate electrode 12. Some embodiments provide that the first portion 20a of the source line 20 may substantially serve as a source electrode in the thin film transistor. The second and the third portions 20b and 20c may be electrically connected to the first portion 20a through additional wirings or the like.

The drain line 22 may have a structure that is substantially symmetrical relative to that of the source line 20. In this regard, the drain line 22 may include a first portion 22a, a second portion 22b and a third portion 22c. The first, second and third portions 22a, 22b and 22c of the drain line 22 may respectively correspond to the first, second and third portions 20a, 20b and 20c of the source line 20.

In some embodiments, the first portion 20a of the source line 20 and the first portion 22a of the drain line 22 may be entirely positioned between the second and the fourth sides 12b and 12d of the gate electrode 12s, so that line widths L2 and L3 of the first portions 20a and 22a may determine overlap areas among the gate electrode 12, the source line 20 and the drain line 22. Thus, the overlap areas among the gate electrode 12, the source line 20 and the drain line 22 may be reduced.

Each of the source and the drain lines 20 and 22 may have a line width substantially the same as or substantially similar to a minimum feature size of a printing process for forming the source and the drain lines 20 and 22. When the source and the drain lines 20 and 22 have minimum line widths, the overlap areas among the gate electrode 12, the source line 20 and the drain line 22 may be minimized. Additionally, a channel length L1 of the thin film transistor may also have a minimum line width through the printing process. Therefore, the source line 20 may have a line width L2 substantially the same as or substantially similar to a line width L3 of the drain line 22. Further, the line widths L2 and L3 of the source and the drain lines 20 and 22 may be substantially the same as or substantially similar to the channel length L1.

In some embodiments, a plurality of first contacts 24 may be formed on the third portion 20c of the source line 20 and the third portion 22c of the drain line 22, respectively. Further, a plurality of second contacts 26 may be positioned on one portion of the gate electrode 12 connected with another portion of the gate electrode 12 which includes the first, the second, the third and the fourth sides 12a, 12b, 12c and 12d.

Although, in some embodiments, a misalignment may occur in a process for forming the source and the drain lines 20 and 22, the overlap areas between the gate electrode 12 and the source line 20 and the gate electrode 12 and the drain line may be constantly maintained regardless of the misalignment of the process for forming the source and the drain lines 20 and 22. When the first contacts 24 and the source line 20 are formed without any misalignment along an X-axis, a first distance x1 between the third portion 20c of the source line 20 and the second side 12b of the gate electrode 12 may be substantially the same as or substantially larger than a maximum misalignment margin along the X-axis in the process. Further, a second distance x2 between the third portion 22c of the drain line 22 and the fourth side 12d of the gate electrode 12 may also be substantially the same as or substantially larger than the maximum misalignment margin along the X-axis. Therefore, a sum of the first and the second distances x1 and x2 may be substantially two times larger than the maximum misalignment margin along the X-axis regardless of a generation of the misalignment in the X-axis. As a result, when the misalignment causes the maximum misalignment margin along the X-axis, the overlap areas among the gate electrode 12, the source line 20 and the drain line 22 may be unaffected. In some embodiments, the maximum misalignment margin along the X-axis may be substantially larger than the minimum line width of a process for forming the source and the drain lines 20 and 22.

When the source and the drain lines 20 and 22 are formed without any misalignment along a Y-axis, a third distance y1 between the second portion 20b of the source line 20 and the first side 12a of the gate electrode 12 may be substantially the same as or substantially larger than a maximum misalignment margin along the Y-axis. Similarly, a fifth distance y2 between the second portion 22b of the drain line 22 and the first side 12a of the gate electrode 12 may also be substantially the same as or substantially larger than the maximum misalignment margin along the Y-axis. Further, the third distance y1 may be substantially the same as or substantially similar to the fifth distance y2.

A fourth distance y3 between an end of the first portion 20a of the source line 20 and one portion of the gate electrode 12 may be substantially the same as or substantially larger than the maximum misalignment margin along the Y-axis. A sixth distance y4 between an end of the first portion 22a of the drain line 22 and one portion of the gate electrode 12 may also be substantially the same as or substantially larger than the maximum misalignment margin along the Y-axis. In this regard, a sum of the third and the fourth distances y1 and y3 may be substantially two times larger than the maximum misalignment margin along the Y-axis regardless of misalignment in the Y-axis. Similarly, a sum of the fifth and sixth distances y2 and y4 may also be substantially two times larger than the maximum misalignment margin in the Y-axis. As a result, when the misalignment occurs at a maximum misalignment margin along the Y-axis, the overlap areas between the gate electrode 12 and the source line 20 and between the gate electrode 12 and the drain line 22 may be unaffected. Furthermore, the end of the first portion 20a of the source line 20 crossing over the gate electrode 12 may be spaced apart from adjacent patterns regardless of the misalignment of the source and the drain lines 20 and 22.

As illustrated, a distance denoted by reference numeral y5 in FIG. 3 may be substantially the same as or substantially larger than the maximum misalignment margin along the Y-axis. Further, end portions of the first portion 22a of the drain line 22 crossing over the gate electrode 12 may also be spaced apart from adjacent patterns.

In some embodiments, when the line widths of the source and the drain lines 20 and 22 are decreased, the overlap areas among the gate electrode 12, the source line 20 and the drain line 22 may be reduced. Additionally, the overlap areas may not vary responsive to misalignments of the source and the drain lines 20 and 22 that may occur during the formation of the source and the drain lines 20 and 22. In this regard, the thin film transistor may ensure an improved cut-off frequency when the overlap areas among the gate electrode 12, the source line 20 and the drain line 22 are reduced.

Figure 4:
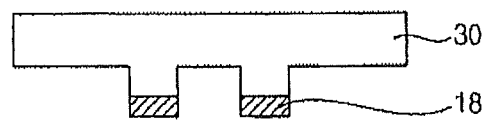
FIGS. 4, 5 and 6 are cross-sectional views illustrating methods of manufacturing a thin film transistor according to some embodiments of the present invention.
Figure 4:
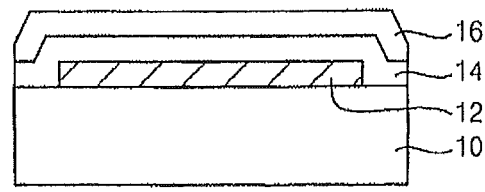
Figure 5:
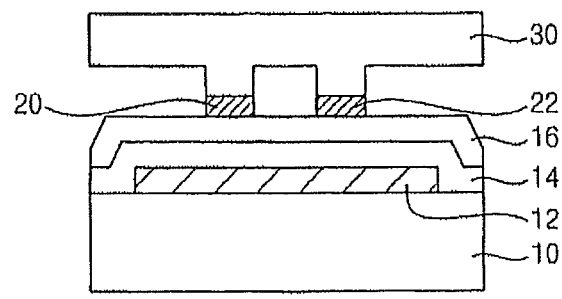
Figure 6:
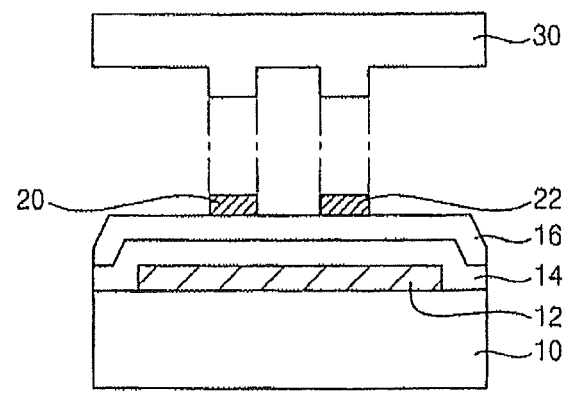

FIGS. 4, 5 and 6 are cross-sectional views illustrating a method of manufacturing a thin film transistor according to some embodiments of the present invention. Referring to FIG. 4, a gate electrode 12 is formed on a substrate 10. The gate electrode 12 may be positioned on an insulation region of the substrate 10. The gate electrode 12 may be formed by a printing process, a plating process, and/or a spraying process, among others. In some embodiments, the gate electrode 12 may be formed through a deposition process and an etching process.

In some embodiments, a gate insulation layer 14 is formed on the substrate 10 to cover the gate electrode 12. For example, the gate insulation layer 14 may be formed by a printing process, a spraying process, and/or a plating process, among others. The gate insulation layer 14 may be formed using an organic material, an inorganic material, and/or a hybrid material, among others. In some embodiments, these may be used alone or in a mixture thereof.

A channel layer 16 may be formed on the gate insulation layer 14. The channel layer 16 may be formed by a printing process, a plating process, and/or a spraying process, among others. The channel layer 16 may be formed using a nano wire, nano particles, a nano tube, an organic material, and/or a hybrid material, among others. For example, the channel layer 16 may be formed using zinc oxide, gallium nitride, silicon, silicon germanium, cadmium sulfide, vanadium oxide, nickel oxide, carbon, gallium arsenic, silicon carbide, zinc sulfide, zinc selenium, zinc tellurium, cadmium sulfide, cadmium selenium, cadmium tellurium, hydrargyrum selenium, hydrargyrum tellurium, copper aluminum sulfide, aluminum indium phosphide, aluminum gallium arsenic, aluminum indium arsenic, aluminum gallium selenium, aluminum indium selenium, gallium indium phosphide, gallium indium arsenic, gallium indium selenium, gallium phosphor arsenic, gallium arsenic selenium, indium phosphor arsenic, and/or indium arsenic selenium, among others. These may be used alone or in a mixture thereof.

Metal layers 18 may be coated on a printing mold 30. The printing mold 30 may include protrusions for forming a source line 20 and a drain line 22 of the thin film transistor. Some embodiments provide that the printing mold 30 is aligned over the substrate 10 so that the protrusions of the printing mold 30 correspond to the source and the drain lines 20 and 22, respectively. In some embodiments, the source and the drain lines 20 and 22 may have minimum line widths provided by the printing process, and distances among the source line 20, the drain line 22 and a channel length L1 may be substantially the same as or substantially similar to the minimum line widths of the printing process.

Referring to FIG. 5, the printing mold 30 is pressed relative to the channel layer 16 to form the source and the drain lines 20 and 22 on the channel layer 16. The source and the drain lines 20 and 22 may have structures substantially the same as or substantially similar to those illustrated in FIG. 3. In some embodiments, the printing process for forming the source and the drain lines 20 and 22 may include a flatbed screen process, a rotary screen process, a Gravnure printing process, a Flexography printing process, an offset process, and/or an inkjet process, among others.

In some embodiments, a printing process for forming the source and the drain lines 20 and 22 may have a considerably high printing speed to provide a high productivity of the thin film transistor. Each of the Gravnure and the Flexography printing processes may ensure a high printing speed for rapidly forming the source and the drain lines 20 and 22.

When the printing process is performed with a high printing speed, however, the high speed printing process may produce a misalignment width that is substantially larger than a minimum line width of a normal printing process. For example, the Gravnure printing process may cause a minimum line width of about 80 μm and a maximum misalignment width of about 200 μm. Further, the Flexography printing processes may cause a minimum line width of about 70 μm and a maximum misalignment width in a range of about 10 μm to about 200 μm.

In the conventional thin film transistor, a source line and a drain line overlapping a gate electrode are formed to have overlap widths no less than a maximum misalignment width to decrease defects produced by the misalignment in the high speed printing process. In this regard, edges of the source and the drain lines overlapping the gate electrode may be positioned out of the gate electrode, which may result in large capacitances among the gate electrode, the source line and the drain line.

According to some embodiments, defects caused by the misalignment in the high speed printing process may be decreased without extending overlap areas among the gate electrode 12, the source line 20 and the drain line 22. Further, the overlap areas may not be increased regardless of the misalignments of the source and the drain lines 20 and 22. In this regard, capacitances among the gate electrode 12, the source line 20 and the drain line 22 may be reduced.

In some embodiments, the source and the drain lines 20 and 22 may be formed to be partially spaced apart from the gate electrode 12 by predetermined distances, so that the overlap areas may not vary regardless of the misalignments of the source and the drain lines 20 and 22. For example, the source and the drain lines 20 and 22 may be formed so that a sum of a first distance x1 and a second distance x2 may be above two times larger than a maximum misalignment margin along an X-axis in the process for forming the source and the drain lines 20 and 22. Additionally, the source and the drain lines 20 and 22 may be formed such that a sum of a third distance y1 and a fourth distance y3 may be above two times larger than a maximum misalignment margin along the Y-axis. Furthermore, the source and the drain lines 20 and 22 may be formed so that a sum of a fifth distance y2 and a sixth distance y4 may be above two times larger than the maximum misalignment margin along the Y-axis. As a result, the overlap areas among the gate electrode 12, the source line 20 and the drain line 22 may be not change regardless of the maximum misalignments along the X-axis and the Y-axis since the source and the drain lines 20 and 22 are separated from the gate electrode 12 by predetermined distances.

Briefly referring to FIG. 6, the printing mold 30 may be removed from the channel layer 16 to thereby manufacture the thin film transistor including the source line 20 and the drain line 22 that partially cover the gate electrode 12.

Figure 7:
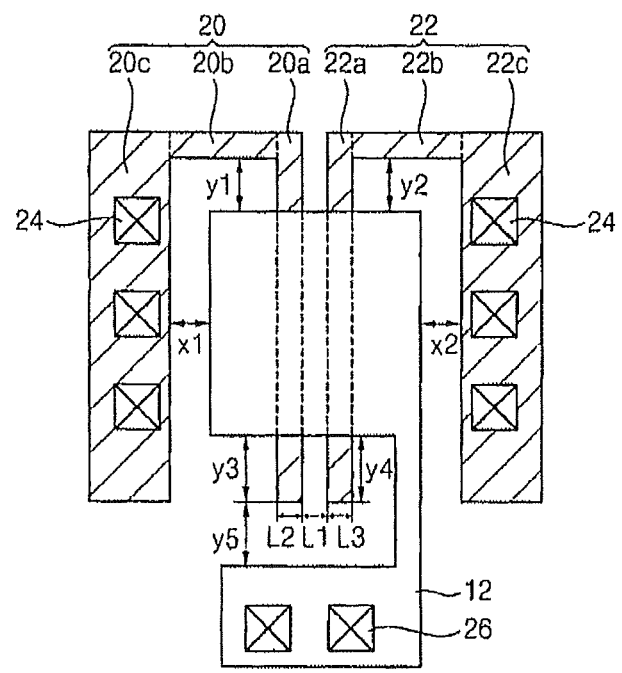
FIG. 7 is a plan view illustrating a thin film transistor according to some embodiments of the present invention.

Reference is now made to FIG. 7, which is a plan view illustrating a thin film transistor according to some embodiments of the present invention. As illustrated in FIG. 7, the thin film transistor may have a construction substantially similar to that of the thin film transistor described with reference to FIG. 3 except for a top gate structure.

A source line 20 and a drain line are provided on a substrate 10. The source and the drain lines 20 and 22 may be positioned on an insulation region of the substrate 10. The source line 20 may be substantially symmetrical to the drain line 22. The source and the drain lines 20 and 22 may have structures substantially the same as or substantially similar to those described with reference to FIG. 3. The source line 20 may include a first portion 20a, a second portion 20b and a third portion 20c, and the drain line 20 may include a first portion 22a, a second portion 22b and a third portion 22c.

The source and the drain lines 20 and 22 are spaced apart from each other by a channel length L1 of the thin film transistor. Each of the source and the drain lines 20 and 22 may have a line width substantially the same as or substantially similar to the channel length L1. Some embodiments provide that the channel length L1 may be substantially the same as or substantially similar to a minimum line width provided by a process for forming the source and the drain lines 20 and 22.

As discussed below in greater detail regarding FIG. 9, a channel layer 16 is disposed on the source and the drain lines 20 and 22, so that surfaces of the source and the drain lines 20 and 22 make contact with the channel layer 16. Some embodiments provide that the channel layer 16 may include a nano wire, nano particles, an organic material, and/or a hybrid material, among others. These may be used alone or in a combination thereof.

As discussed below in greater detail regarding FIG. 9, a gate insulation layer 14 is formed on the channel layer 16. The gate insulation layer 14 may include an organic material, an inorganic material, and/or a hybrid material, among others. These may be used alone or in a combination thereof.

In some embodiments, a gate electrode 12 is positioned on the channel layer 16. The gate electrode 12 covers the first portions 20a of the source line 20 and the first portion 22a of the drain line 22.

According some embodiments, overlap areas may be decreased among the gate electrode 12, the source line 20 and the drain line 22 as described with reference to FIG. 3. Hence, the thin film transistor may also ensure a desired high cut-off frequency.

Figure 8:
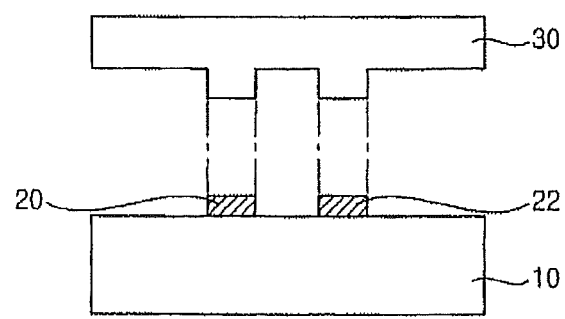
FIGS. 8, 9 and 10 are cross-sectional views illustrating methods of manufacturing a thin film transistor according to some embodiments of the present invention.
Figure 9:
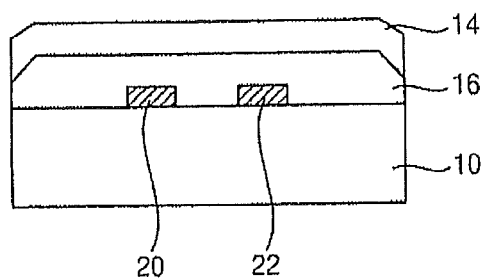
Figure 10:
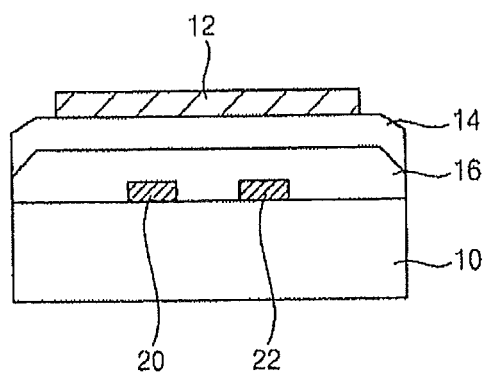

Reference is now made to FIGS. 8, 9 and 10, which are cross-sectional views illustrating methods of manufacturing a thin film transistor according to some embodiments of the present invention. A source line 20 and a drain line 22 may be formed on a substrate 10. The source and the drain lines 20 and 22 may be located in an insulation region of the substrate 10. The source and the drain lines 20 and 22 may be formed by a printing process. For example, a Gravnure printing process and/or a Flexography printing process may employed as a high speed printing process for forming the source and the drain lines 20 and 22. In some embodiments, the source and the drain lines 20 and 22 may be formed by another printing process such as a flatbed screen process, a rotary screen process, an offset process, and/or an inkjet process, among others.

Referring to FIG. 9, a channel layer 16 is formed on the substrate 10 to cover the source and the drain lines 20 and 22. For example, the channel layer 16 may be formed by a printing process using a nano wire, nano particles, a nano tube, an organic material, and/or a hybrid material, among others.

A gate insulation layer 14 is formed on the channel layer 16. The gate insulation layer 14 may be formed by a printing process, a plating process, and/or a spraying process, among others. Some embodiments provide that the gate insulation layer 14 may be formed using an organic material, an inorganic material, and/or a hybrid material, among others. These may be used alone or in a mixture thereof.

Referring to FIG. 10, a gate electrode 12 may be formed on the gate insulation layer 14. The gate electrode 12 may be formed by a printing process, a spraying process, and/or a plating process, among others. In some embodiments, the gate electrode 12 may be formed by a deposition process and an etching processes. After forming the gate electrode 12, the thin film transistor having the top gate structure may be provided on the substrate 10.

Figure 11:
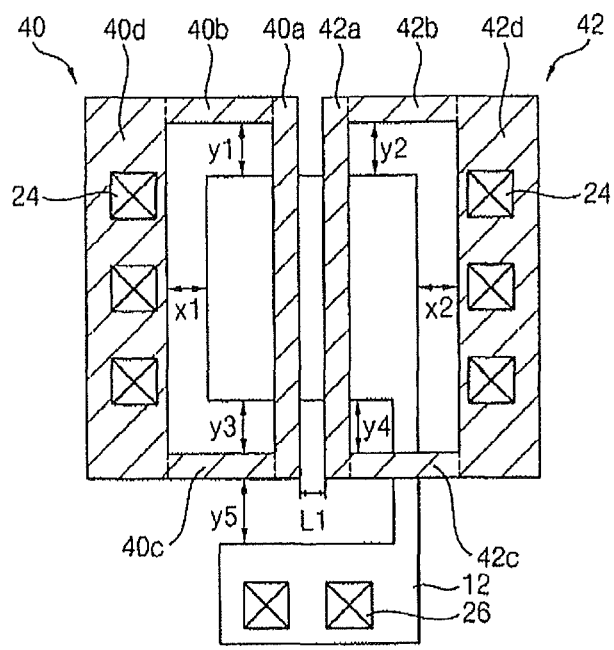
FIG. 11 is a plan view illustrating a thin film transistor according to some embodiments of the present invention.

Reference is now made to FIG. 11, which is a plan view illustrating a thin film transistor according to some embodiments of the present invention. The thin film transistor illustrated in FIG. 10 may have a construction substantially similar to that of the thin film transistors described above with reference to FIG. 3 or FIG. 7 except for a source line 40 and a drain line 42.

The thin film transistor includes a gate electrode 12, a gate insulation layer (not illustrated) and a channel layer (not illustrated) positioned on a substrate (not illustrated). In some embodiments, the gate electrode 12 may be disposed in an insulation region of the substrate.

The source and the drain lines 40 and 42 are provided on the channel layer along a direction substantially crossing over the gate electrode 12. The source and the drain lines 40 and 42 corresponding to the gate electrode 12 may be spaced apart from each other by a channel length L1 of the thin film transistor. Some embodiments provide that each of the source and the drain lines 40 and 42 may have a line width substantially the same as or substantially similar to the channel length L1 of the thin film transistor.

In some embodiments, the source line 40 includes a first portion 40a, a second portion 40b, a third portion 40c and a fourth portion 40d. The first portion 40a of the source line 40 may cross over the gate electrode 12. The second portion 40b may be connected to a first end of the first portion 40a. The second portion 40b of the source line 40 may be spaced apart from a first side of the gate electrode 12. The third portion 40c may be connected with a second end of the first portion 40a. The third portion 40c of the source line 40 may be spaced apart from a third side of the gate electrode 12 substantially opposed to the first side of the gate electrode 12. The fourth portion 40d may be connected with the second and the third portions 40b and 40c. The fourth portion 40d of the source line 40 may be spaced apart from a second side of the gate electrode 12. The first portion 40a of the source line 40 may substantially serve as a source electrode in the thin film transistor. The second, the third and the fourth portions 40b, 40c and 40d may be electrically connected to the first portion 40a through contacts.

The drain line 42 may have a structure being substantially symmetrical to that of the source line 40. The drain line 42 may include a first portion 42a, a second portion 42b, a third portion 42c and a fourth portion 42d, which may respectively correspond to the first portion 40a, the second portion 40b, the third portion 40c and the fourth portion 40d of the source line 40. Both sides of the first portion 40a of the source line 40 and the first portion 42a of the drain line 42 may be entirely positioned between the second side of the gate electrode 12 and a fourth side of the gate electrode 12 substantially opposed to the second side.

Some embodiments provide that each of the source and the drain lines 40 and 42 may have a line width substantially the same as or substantially similar to a minimum line width provided by a printing process for forming the source and the drain lines 40 and 42. Additionally, a channel length L1 of the thin film transistor may also have the minimum line width in the printing process. Misalignments may occur in the process for forming the source and the drain lines 40 and 42. However, overlap areas among the gate electrode 12, the source line 40 and the drain line 42 may be maintained regardless of the misalignments of the source and the drain lines 40 and 42.

In some embodiments, a sum of a first distance x1 and a second distance x2 may be substantially two times larger than a maximum misalignment margin along an X-axis in the process for forming the source and the drain lines 40 and 42. The first distance x1 may be referred to as a distance between the fourth portion 40d of the source line 40 and the second side of the gate electrode 12. The second distance x2 may be referred to as a distance between the fourth portion 42d of the drain line 42 and the fourth side of the gate electrode 12. Further, a sum of a third distance y1 and a fourth distance y3 may be substantially two times larger than a maximum misalignment margin along a Y-axis in the process for forming the source and the drain lines 40 and 42. The third distance y1 may be referred to as a distance between the second portion 40b of the source line 40 and the first side of the gate electrode 12. The fourth distance y3 may be referred to as a distance between the third portion 40c of the source line 40 and the third side of the gate electrode 12. Similarly, a sum of a fifth distance y2 and a sixth distance y4 may be substantially two times larger than the maximum misalignment margin along the Y-axis. The fifth distance y2 may be referred to as a distance between the second portion 42b of the drain line 42 and the first side of the gate electrode 12. The sixth distance y4 may be referred to as a distance between the third portion 42c of the drain line 42 and the third side of the gate electrode 12. A distance denoted by a reference numeral of y5 in FIG. 11 may be substantially the same as or substantially larger than the maximum misalignment margin along the Y-axis.

Since the source and the drain lines 40 and 42 may be separated from the gate electrode 12 by predetermined distances, the overlap areas between the gate electrode 12 and the source line 40 and between the gate electrode 12 and the drain line 42 may be unchanged regardless of the maximum misalignments along the X-axis and the Y-axis that may occur in the process of forming the source and the drain lines 40 and 42.

A plurality of first contacts 24 may be respectively formed on the fourth portion 40d of the source line 40 and the fourth portion 42d of the drain line 42. Further, a plurality of second contacts 26 may be formed on one portion of the gate electrode 12 connected with another portion of the gate electrode 12 which includes the first side, the second side, the third side and the fourth side.

In some embodiments, the thin film transistor having a bottom gate structure may be provided on the substrate. Some embodiments provide that a thin film transistor may have a top gate structure substantially the same as or substantially similar to those of the thin film transistor described with reference to FIG. 3.

The thin film transistor illustrated in FIG. 11 may be manufactured by methods substantially the same as or substantially similar to methods described above with reference to FIGS. 4 to 6 or FIGS. 8 to 10 except for a printing mold for forming the source and the drain lines 40 and 42.

In some embodiments, the source and the drain lines 40 and 42 may have structures substantially different from those of the source and the drain lines described with reference to FIG. 3 or FIG. 7. The source and the drain lines 40 and 42 may be formed by changing a construction of a printing mold in a printing process for forming the source and the drain lines 40 and 42.

Figure 12:
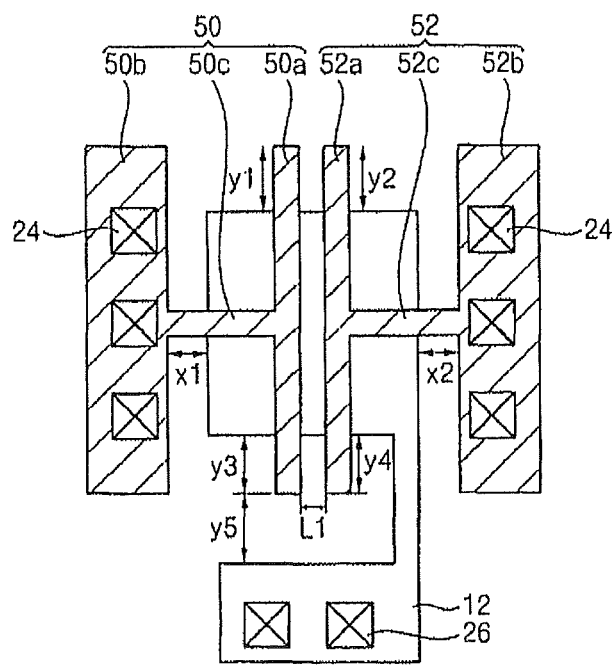
FIG. 12 is a plan view illustrating a thin film transistor according to some embodiments of the present invention.

Reference is now made to FIG. 12, which is a plan view illustrating a thin film transistor according to some embodiments of the present invention. The thin film transistor illustrated in FIG. 12 may have a construction substantially similar to that of the thin film transistor described with reference to FIG. 3 except for a source line 50 and a drain line 52. Referring to FIG. 12, the thin film transistor includes a gate electrode 12, a gate insulation layer (not illustrated) and a channel layer (not illustrated) positioned on a substrate (not illustrated). The gate electrode 12 may be disposed in an insulation region of the substrate.

The source and the drain lines 50 and 52 may be disposed on the channel layer along a direction substantially crossing over the gate electrode 12. Some embodiments provide that the source and the drain lines 50 and 52 corresponding to the gate electrode 12 may be spaced apart from each other by a channel length L1 of the thin film transistor.

In some embodiments, the source line 50 includes a first portion 50a, a second portion 50b and a third portion 50c. The first portion 50a of the source line 50 may cross over the gate electrode 12. The second portion 50b of the source line 50 may be spaced apart from a second side of the gate electrode 12. The third portion 50c may connect a center of the first portion 50a with a center of the second portion 50b. The third portion 50c of the source line 50 may be partially overlapped with the gate electrode 12. The first portion 50a of the source line 50 may substantially correspond to a source electrode. The second and the third portions 50b and 50c may electrically connect the first portion 50a with contacts.

Some embodiments provide that the drain line 52 may be substantially symmetrical to the source line 50. That is, the drain line 52 may include a first portion 52a, a second portion 52b and a third portion 52c substantially corresponding to the first portion 50a, the second portion 50b and the third portions 50c of the source line 50, respectively.

Some embodiments provide that both sides of the first portion 50a of the source line 50 and the first portion 52a of the drain line 52 may be entirely positioned between a second side and a fourth side of the gate electrode 12 substantially opposed to the second side. Each of the source and the drain lines 50 and 52 may have a line width substantially the same as or substantially similar to a minimum line width provided by a process for forming the source and the drain lines 50 and 52. In some embodiments, the channel length L1 may have the minimum line width in the process for forming the source and the drain lines 50 and 52.

Misalignments may occur in the process for forming the source and the drain lines 50 and 52. In some embodiments, the source and the drain lines 50 and 52 may be formed to ensure a predetermined distance from the gate electrode 12. In this regard, overlap areas among the gate electrode 12, the source line 50 and the drain line 52 may be constantly maintained regardless of misalignments of the source and the drain lines 50 and 52.

In some embodiments, a sum of a first distance x1 and a second distance x2 may be substantially two times larger than a maximum misalignment margin along an X-axis in the process for forming the source and the drain lines 50 and 52. The first distance x1 may be referred to as a distance between the second portion 50b of the source line 50 and a second side of the gate electrode 12. The second distance x2 may be referred to as a distance between the second portion 52b of the drain line 52 and the fourth side of the gate electrode 12. Additionally, a sum of a third distance y1 and a fourth distance y3 may be substantially two times larger than a maximum misalignment margin along a Y-axis in the process. The third distance y1 may be referred to as a distance between a first end of the first portion 50a of the source line 50 and the first side of the gate electrode 12. The fourth distance y3 may be referred to as a distance between a second end of the first portion 50a of the source line 50 and the third side of the gate electrode 12. Some embodiments provide that a sum of fifth distance y2 and a sixth distance y4 may be substantially two times larger than the maximum misalign margin along the Y-axis. The fifth distance y2 may be referred to as a distance between a first end of the first portion 52a of the drain line 52 and the first side of the gate electrode 12. The sixth distance y4 may be referred to as a distance between a second end of the first portion 52a of the drain line 52 and the third side of the gate electrode 12. A distance denoted by a reference numeral of y5 may be substantially the same as or substantially larger than the maximum misalignment margin along the Y-axis.

As formations of the source and the drain lines 50 and 52 may be separated from the gate electrode 12 by predetermined distances, the overlap areas among the gate electrode 12, the source line 50 and the drain line 52 may be unchanged regardless of the maximum misalignments along the X-axis and the Y-axis even though the maximum misalignments may occur during the formation of the source and the drain lines 50 and 52.

A plurality of first contacts 24 may be respectively formed on the third portion 50c of the source line 50 and the third portion 52c of the drain line 52, and a plurality of second contacts 26 may be provided at one portion of the gate electrode 12 connected with another portion of the gate electrode 12 which includes the first, the second, the third and the fourth sides.

In some embodiments, the thin film transistor may have a bottom gate structure in which the gate electrode 12 is disposed on the substrate. Alternatively, the thin film transistor may have a top gate structure including the source and the drain lines 50 and 52 having constructions substantially the same as or substantially similar to those described above with reference to FIG. 7.

Comparative Examples 1 to 5

Five thin film transistors were manufactured according to Comparative Examples 1 to 5 to have conventional bottom gate structures, respectively. The thin film transistors according to Comparative Examples 1 to 5 respectively had constructions substantially the same as that of the thin film transistor illustrated in FIG. 2. In these thin film transistors according to Comparative Examples 1 to 5, an overlap area between a gate electrode and a source line was different from an overlap area between the gate electrode and a drain line.

The thin film transistors according to Comparative Examples 1 to 5 were respectively formed by printing processes different from each other in view of minimum line widths and maximum misalignment widths in the printing processes. The following table shows the misalignment widths and the minimum line widths in the printing processes, and overlap areas and channels length of the thin film transistors according to Comparative Examples 1 to 5.

Examples 1 to 5

Five thin film transistors having bottom gate structures were manufactured according to Examples 1 to 5 to compare with the thin film transistors according to the Comparative Examples 1 to 5. In the thin film transistors according to Examples 1 to 5, printing speeds and misalignment widths of printing processes were different from each other due to the printing processes respectively having characteristics different from each other. The thin film transistors according to Examples 1 to 5, however, had substantially the same constructions and overlap areas. Further, the thin film transistors according to Examples 1 to had substantially the same channel lengths and line widths of source and drain lines in comparison with the thin film transistors according to Comparative Examples 1 to 5. The following table shows the misalignment widths and the minimum line widths of the printing processes, and overlap areas and channel lengths of the thin film transistors according to Examples 1 to 5.

TABLE

|  | Misalignment width/ Minimum line width | Overlap area/ Channel length |
|---|---|---|
| Comparative Example 1 | 1 | 1 |
| Comparative Example 2 | 1.5 | 1.5 |
| Comparative Example 3 | 2 | 2 |
| Comparative Example 4 | 3 | 3 |
| Comparative Example 5 | 4 | 4 |
| Example 1 | 1 | 1 |
| Example 2 | 1.5 | 1 |
| Example 3 | 2 | 1 |
| Example 4 | 3 | 1 |
| Example 5 | 4 | 1 |

As shown in the above table, the thin film transistors according to Comparative Examples 1 to 5 have the channel lengths substantially the same as the minimum line widths of the printing processes. Additionally, the gate electrodes overlap the source lines by the maximum misalignment widths of the printing processes and the gate electrodes overlap the drain lines by the maximum misalignment width of the printing processes. In this regard, the overlap areas of the thin film transistors according to Comparative Examples 1 to 5 are increased when the maximum misalignment widths are increased.

However, in the thin film transistors according to Examples 1 to 5, the overlap areas among the gate electrodes, the source lines and the drain lines do not increase although the maximum misalignment widths increase.

Normalized frequencies are calculated relative to the thin film transistors according to Comparative Examples 1 to 5 and the thin film transistors according to Examples 1 to 5.

Figure 13:
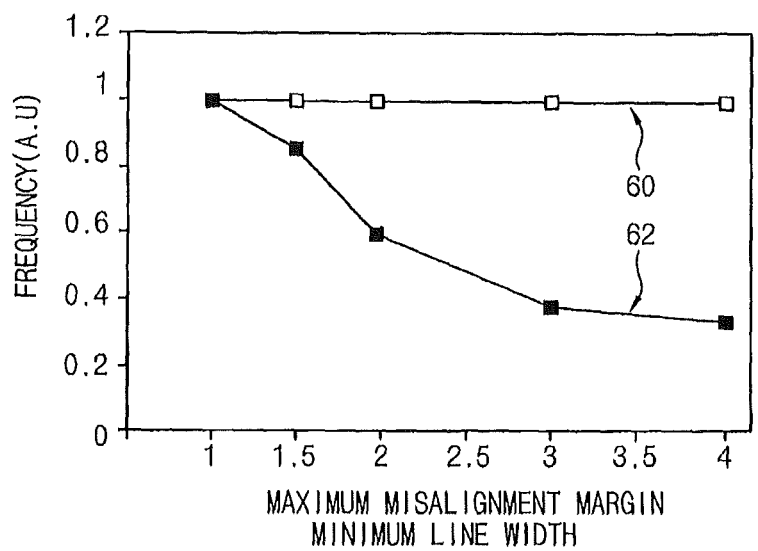
FIG. 13 is a graph showing normalized frequencies of thin film transistors according to Comparative Examples 1 to 5 and Examples 1 to 5.

Reference is now made to FIG. 13, which is a graph showing normalized frequencies of the thin film transistors according to Comparative Examples 1 to 5 and Examples 1 to 5. FIG. 13 shows relative frequencies measured from the thin film transistors according to Comparative Examples and Examples when frequencies of the thin film transistors are assumed as 1 with the maximum misalignments and the minimum line widths of corresponding examples being substantially the same as one another.

Considering a first line 60 showing the frequencies of the thin film transistors according to Examples 1 to 5, the frequencies of the thin film transistors according to Examples 1 to 5 are not changed when the maximum misalignments vary. Considering a second line 62 showing the frequencies of the thin film transistors according to Comparative Examples 1 to 5, the frequencies of the thin film transistors according to Comparative Examples 1 to 5 are decreased when the maximum misalignments are increased. Thus, a cut-off frequency of a thin film transistor may be remarkably decreased when the thin film transistor is obtained by a high speed printing processes. As a result, a thin film transistor having a high cut-off frequency may be manufactured with a low coat by a high speed printing process according to example embodiments.

Figure 14:
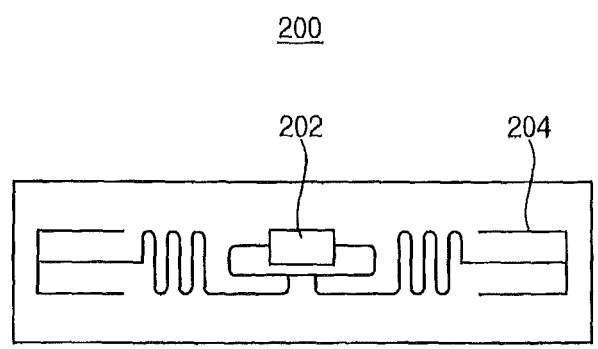
FIG. 14 is a plan view illustrating an RFID tag according to some embodiments of the present invention.

Brief reference is now made to FIG. 14, which is a plan view illustrating an RFID tag according to some embodiments of the present invention. An RFID tag 200 includes an integrated circuit (IC) chip 202 and an antenna 204. An RF transmitter-receiver circuit, a control logic and a memory may be installed in the IC chip 202. The IC chip 202 may communicate a radio frequency through the antenna 204. The RF transmitter-receiver circuit includes the thin film transistor according to example embodiments. The RFID tag 200 may reflect RF signals in a bandwidth of an ultra-high frequency (UHF) and may transmit modulated signals including discrimination data through the RF signals to a reader.

Figure 15:
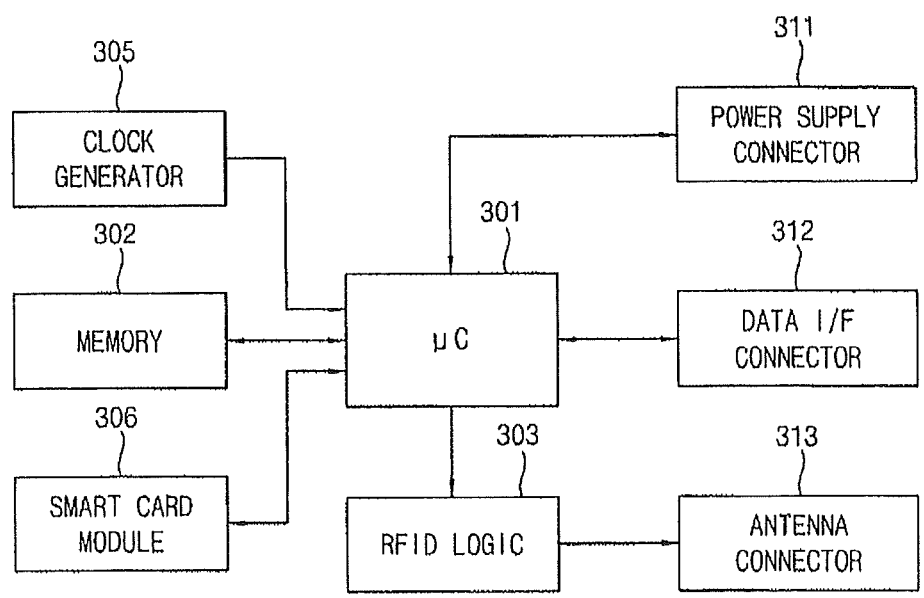
FIG. 15 is a block diagram illustrating a memory module in a smart card according to some embodiments of the present invention.

Reference is now made to FIG. 15, which is a block diagram illustrating a memory module in a smart card according to some embodiments of the present invention. A memory module 300 in the smart card is controlled by a control circuit such as a microcontroller (μC) 301. The microcontroller 301 is electrically connected with a memory 302. The memory 302 may store digital information, data and data record. The memory 302 may include a flash random access memory (RAM) providing reading and writing or a read-only memory (ROM). The memory 302 may be formed through data storage technology. The memory 302 is accessed via a data interface (I/F) connecter 312 to read and/or write data. The data interface connector 312 may connect the memory module 300 in the smart card with a connector corresponding to a data interface of a portable CE device. Additionally, the memory 302 is accessed via an RFID logic 303 including the RF transmitter-receiver circuit to read and/or write data.

A radio frequency signal generated by the RFID logic 303 is transmitted to the portable CE device through an antenna connector 313. The RFID logic 303 may receive data signals including read data from the memory 302 from the microcontroller 301 of the memory module 300 of smart card, and inserts the data signals into bandwidth based on radio frequency. The data signals may be provided to the microcontroller 301. The data signals may include instruction words controlling the microcontroller 301 and/or information written on the memory 302. A clock signal provided by a clock generator 305 may be used for functions of the microcontroller 301 and the RFID logic 303. In some embodiments, a clock signal may be generated from a radio frequency provided to the RFID logic 303.

A power supply connector 311 provides electrical power with the memory module 300 in the smart card. The power supply connector 311 may electrically connected with a power supply of the portable CE device such as a battery and/or a rechargeable condenser. In some embodiments, electrical power may be provided with the memory module 300 of smart card through an external power source.

The memory module 300 of smart card may include a smart card module 306. Some embodiments provide that data related to security may be stored in the smart card module 306. In this regard, the smart card module 306 may include code logic and/or an identification mechanism to meet security conditions.

According to some embodiments, a thin film transistor ensuring a high cut-off frequency may be manufactured with a low cost, so that the thin film transistor may be employed in various devices that require a high cut-off frequency. For example, the thin film transistor according to some embodiments may be employed in radio frequency identification (RFID) apparatuses, RFID tags, electronic article surveillance (EAS) tags, various sensors, and/or chips including switching elements, among others.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A method of manufacturing a thin film transistor, comprising:
    forming a layer structure including a gate electrode, a gate insulation layer and a channel layer; and
    forming a source line and a drain line to make contact with the channel layer, the source line extending along a direction crossing over the gate electrode and partially overlapping the gate electrode in which both sides of the source line overlapping the gate electrode are entirely positioned between both sides of the gate electrode, and the drain line being spaced apart from the source line by a channel length and having a structure symmetrical to that of the source line,
    wherein the source line is partially spaced apart from a side of the gate electrode, so that the source line partially surrounds the side of the gate electrode, and the drain line is partially spaced apart from the side of the gate electrode to symmetrically extend with the source line.

2. The method of claim 1, wherein the drain line partially overlaps the gate electrode so that both sides of the drain line overlapping the gate electrode are entirely positioned between the both sides of the gate electrode.

3. The method of claim 1, wherein the source and the drain lines are formed by a printing process.

4. The method of claim 1, wherein the source and the drain lines are formed, so that a sum of a distance between the source line deviating from the gate electrode and the side of the gate electrode along an X-axis, and a distance between the drain line deviating from the gate electrode and the side of the gate electrode along the X-axis is substantially two times larger than a maximum alignment margin along the X-axis in a process for forming the source and the drain lines.

5. The method of claim 1, wherein the source and the drain lines are formed such that a sum of a distance between a first end of the source line crossing over the gate electrode and the side of the gate electrode along a Y-axis, and a distance between a second end of the source line crossing over the gate electrode and the side of the gate electrode along the Y-axis is substantially two times larger than a maximum alignment margin along the Y-axis in a process for forming the source and the drain lines.

6. A method of manufacturing a thin film transistor, comprising:
    forming a gate electrode on a substrate;
    forming a gate insulation layer covering the gate electrode;
    forming a channel layer covering the gate insulation layer; and
    forming a source line and a drain line on the channel layer, the source line extending along a direction crossing over the gate electrode and partially overlapping the gate electrode in which both sides of the source line overlapping the gate electrode are entirely positioned between both sides of the gate electrode, and the drain line being spaced apart from the source line by a channel length, and having a structure symmetrical with that of the source line,
    wherein the source line is partially spaced apart from a side of the gate electrode, so that the source line partially surrounds the side of the gate electrode, and the drain line is partially spaced apart from the side of the gate electrode to symmetrically extend with the source line.

7. The method of claim 6, wherein a sum of a distance between the source line deviating from the gate electrode and the side of the gate electrode along an X-axis, and a distance between the drain line deviating from the gate electrode and the side of the gate electrode along the X-axis is substantially two times larger than a maximum alignment margin along the X-axis in a process for forming the source and the drain lines.

8. The method of claim 6, wherein the drain line partially overlaps the gate electrode, so that both sides of the drain line overlapping the gate electrode are entirely positioned between the both sides of the gate electrode.

9. The method of claim 8, wherein a printing process for forming the source and the drain lines provides a minimum line width substantially smaller than a maximum misalignment width.

10. A method of manufacturing a thin film transistor, comprising:
    forming a source line and a drain line on a substrate, the source and the drain lines being spaced apart from each other by a channel length;
    forming a channel layer covering the substrate, the source line and the drain line;
    forming a gate insulation layer covering the channel layer; and
    forming a gate electrode on the gate insulation layer to cover the source and the drain lines,
    wherein the source line is partially spaced apart from a side of the gate electrode, so that the source line partially surrounds the side of the gate electrode, and the drain line is partially spaced apart from the side of the gate electrode to symmetrically extend with the source line.

11. The method of claim 10, wherein a sum of a distance between the source line deviating from the gate electrode and the side of the gate electrode along an X-axis, and a distance between the drain line deviating from the gate electrode and the side of the gate electrode along the X-axis is substantially two times larger than a maximum alignment margin along the X-axis in a process for forming the source and the drain lines.

* * * * *